United States Patent [19]

Hults et al.

[11] Patent Number: 5,300,486
[45] Date of Patent: Apr. 5, 1994

[54] SYNTHESIS OF BIPBSRCACUO SUPERCONDUCTOR

[75] Inventors: William L. Hults, Los Alamos; Kimberly A. Kubat-Martin; Kenneth V. Salazar, both of Espanola; David S. Phillips; Dean E. Peterson, both of Los Alamos, all of N. Mex.

[73] Assignee: The United States of America as represented by the United States Department of Energy, Washington, D.C.

[21] Appl. No.: 67,911

[22] Filed: May 27, 1993

[51] Int. Cl.$^5$ ............ C01F 11/02; C01F 3/02; C01F 29/00; H01L 39/12
[52] U.S. Cl. .................... 505/501; 423/593; 505/725; 505/742; 505/782; 505/510; 505/121
[58] Field of Search ............ 505/782, 784, 725, 742; 423/593

[56] References Cited

U.S. PATENT DOCUMENTS

| | | | |
|---|---|---|---|
| 5,026,680 | 6/1991 | Sugihara | 423/593 |
| 5,049,541 | 9/1991 | Uzumaki | 505/1 |
| 5,057,488 | 10/1991 | Arendt | 505/782 |
| 5,236,889 | 8/1993 | Sugihara | 505/782 |

FOREIGN PATENT DOCUMENTS

| | | | |
|---|---|---|---|
| 0092827 | 4/1990 | Japan | 505/782 |
| 0120234 | 5/1990 | Japan | 505/782 |
| 0172823 | 7/1990 | Japan | 505/782 |

OTHER PUBLICATIONS

Shiloh "Formation of $(Ca_{1-x}Sr_x)_2PbO_4$ in Bi(Pb)-Sr-Ca-Cu-O..." *J. Appl. Phys.* v. 68(5) Sep. 1, 1990, pp. 2304–2307.

Marshall "Two-dimensional superstructure in the (001) plane of $Bi_2[Ca,Sr]_3Cu_2O_{8+y}$ thin films", *Appl. Phys. Lett.* v. 53(5) Aug. 1, 1988, pp. 426–428.

*Primary Examiner*—Paul Lieberman
*Assistant Examiner*—John Boyd
*Attorney, Agent, or Firm*—Bruce H. Cottrell; Paul D. Gaetgens; William R. Moser

[57] ABSTRACT

A process and a precursor composition for preparing a lead-doped bismuth-strontium-calcium-copper oxide superconductor of the formula $Bi_aPb_bSr_cCa_dCu_eO_f$ wherein a is from about 1.7 to about 1.9, b is from about 0.3 to about 0.45, c is from about 1.6 to about 2.2, d is from about 1.6 to about 2.2, e is from about 2.97 to about 3.2 and f is $10\pm z$ by reacting a mixture of $Bi_4Sr_3Ca_3Cu_4O_{16\pm z}$, an alkaline earth metal cuprate, e.g., $Sr_9Ca_5Cu_{24}O_{41}$, and an alkaline earth metal plumbate, e.g., $Ca_{2-x}Sr_xPbO_4$ wherein x is about 0.5, is disclosed.

7 Claims, No Drawings

SYNTHESIS OF BIPBSRCACUO SUPERCONDUCTOR

The invention is a result of a contract with the Department of Energy (Contract No. W-7405-ENG-36).

FIELD OF THE INVENTION

The present invention relates to field of ceramic cuprate superconductors and more particularly to a precursor composition for synthesis of a BiPbSrCaCuO superconductor and to the synthesis of the BiPbSrCaCuO superconductor.

BACKGROUND OF THE INVENTION

There continues to be strong interest in the development of high temperature superconducting wires and tapes for applications such as magnets, transmission lines and magnetic energy storage systems. The superconducting material most usually employed for these tapes and wires is a 2-2-2-3 phase of lead-doped bismuth-strontium-calcium-copper oxide wherein the numbers represent the approximate respective molar ratios of the bismuth, strontium, calcium and copper substituents. In a typical wire preparation, a partially sintered powder, i.e., a powder consisting primarily of a combination of a 2-2-1-2 phase bismuth-strontium-calcium-copper oxide and other calcium, copper and lead-containing phases that will yield the desired 2-2-2-3 phase upon subsequent sintering, is loaded into a tube, e.g., a silver tube, and then mechanically deformed into a thin wire and/or tape. After deformation, the final conversion via sintering to the 2-2-2-3 phase takes place.

Various processes for the preparation of superconductors such as the lead-doped bismuth-strontium-calcium-copper oxide superconductor are known including preparation from the respective metal carbonates, metal oxides or metal nitrates. While such processes are known, these processes typically involve long sintering stages of about 2 weeks or longer. Thus, there remains a need for further simple, economical processes that will enable the preparation of the 2-2-2-3 lead-doped bismuth-strontium-calcium-copper oxide product.

In exploring the preparation of such lead-doped bismuth-strontium-calcium-copper oxide superconductors, the applicants have now discovered a precursor composition useful in the comparatively quick preparation of the 2-2-2-3 lead-doped bismuth-strontium-calcium-copper oxide product and a process of preparing the 2-2-2-3 lead-doped bismuth-strontium-calcium-copper oxide product from a solid state reaction of a mixture of $Bi_4Sr_3Ca_3Cu_4O_{16\pm z}$, alkaline earth cuprates and alkaline earth plumbates as solid solution precursors. Such a precursor composition for preparation of the 2-2-2-3 lead-doped bismuth-strontium-calcium-copper oxide product could be used in place of the partially sintered materials typically used at the present time in the preparation of superconducting wires and tapes.

Accordingly, it is an object of the present invention to provide a process of preparing a lead-doped BiSrCaCuO superconductor material.

Still another object of this invention is to provide a precursor composition that can be thermally processed to a lead-doped BiSrCaCuO superconductor material.

SUMMARY OF THE INVENTION

To achieve the foregoing and other objects, and in accordance with the purposes of the present invention, as embodied and broadly described herein, the present invention provides a composition of matter useful as a precursor mixture for subsequent processing into a high temperature superconductive product comprising a mixture of $Bi_4Sr_3Ca_3Cu_4CO_{16\pm z}$ powder, an alkaline earth metal cuprate powder, e.g., $Sr_9Ca_5Cu_{24}O_{41}$ powder, and an alkaline earth metal plumbate powder, e.g., $Ca_{1.5}Sr_{0.5}PbO_4$ powder, said mixture in amounts calculated to yield a lead-doped bismuth-strontium-calcium-copper oxide superconductor of the general formula $Bi_aPb_bSr_cCa_dCu_eO_f$ wherein a is from about 1.7 to about 1.9, b is from about 0.3 to about 0.45, c is from about 1.6 to about 2.2, d is from about 1.6 to about 2.2, e is from about 2.97 to about 3.2 and f is $10\pm z$ upon subsequent thermal processing.

The present invention further provides a process for preparing a lead-doped bismuth-strontium-calcium-copper oxide superconductor of the general formula $Bi_aPb_bSr_cCa_dCu_eO_f$ wherein a is from about 1.7 to about 1.9, b is from about 0.3 to about 0.45, c is from about 1.6 to about 2.2, d is from about 1.6 to about 2.2, e is from about 2.97 to about 3.2 and f is $10\pm z$ including reacting a mixture of $Bi_4Sr_3Ca_3Cu_4O_{16\pm z}$ powder, an alkaline earth metal cuprate powder, e.g., $Sr_9Ca_5Cu_{24}O_{41}$ powder, and an alkaline earth metal plumbate powder, e.g., $Ca_{1.5}Sr_{0.5}PbO_4$ powder, said mixture in amounts calculated to yield a lead-doped bismuth-strontium-calcium-copper oxide superconductor of the general formula $Bi_aPb_bSr_cCa_dCu_eO_f$ wherein a is from about 1.7 to about 1.9, b is from about 0.3 to about 0.45, c is from about 1.6 to about 2.2, d is from about 1.6 to about 2.2, e is from about 2.97 to about 3.2 and f is $10\pm z$.

DETAILED DESCRIPTION

The present invention is concerned with the preparation of lead-doped bismuth-strontium-calcium-copper oxide superconductor material, e.g., powder, of the general basic formula $Bi_aPb_bSr_cCa_dCu_eO_f$ wherein a is from about 1.7 to about 1.9, b is from about 0.3 to about 0.45, c is from about 1.6 to about 2.2, d is from about 1.6 to about 2.2, e is from about 2.97 to about 3.2 and f is $10\pm z$, and to a precursor composition for subsequent processing into a high temperature superconductive product.

The starting materials in the present process have been found critical in obtaining the desired 2-2-2-3 phase superconductive material. For the lead-doped bismuth-strontium-calcium-copper oxide superconductive material, the starting materials preferably include $Bi_4Sr_3Ca_3Cu_4O_{16\pm z}$, an alkaline earth metal cuprate and an alkaline earth metal plumbate. The alkaline earth metal cuprate and alkaline earth metal plumbate should contain the necessary amounts of strontium, calcium, copper and lead to achieve the desired stoichiometry in the final superconductive material. A combination of $Sr_9Ca_5Cu_{24}O_{41}$ as the alkaline earth metal cuprate and of $Ca_{2-x}Sr_xPbO_4$ wherein x is about 0.5 as the alkaline earth metal plumbate has been found to be especially preferred.

In one embodiment, the precursor composition can include as a mixture of the starting materials, $Bi_4Sr_3Ca_3Cu_4O_{16\pm z}$, $Sr_9Ca_5Cu_{24}O_{41}$, and $Ca_{1.5}Sr_{0.5}PbO_4$ powders. The precursor composition includes the starting materials in amounts calculated to yield a lead-doped bismuth-strontium-calcium-copper oxide superconductor of the general formula $Bi_aPb_bSr_cCa_dCu_eO_f$ wherein a is from about 1.7 to about 1.9, b is from about 0.3 to about 0.45, c is from about 1.6 to about 2.2, d is from about 1.6 to about 2.2, e is from about 2.97 to about 3.2 and f is $10\pm z$ upon subsequent thermal processing. This precursor composition can be readily used, e.g., in the preparation of superconductive wires and tapes. The precursor composition can be inserted into a tube, e.g., a silver tube, and the filled tube then mechanically deformed into a thin wire and/or tape. After deformation, the final conversion via thermal processing, i.e., sintering, of the precursor composition to the resultant superconductive material can be conducted.

In the present process and precursor composition, the starting materials have a fine particle size to promote inter-reaction between particles. Generally, the particle sizes for the starting materials, e.g., the $Bi_4Sr_3Ca_3Cu_4O_{16\pm z}$, $Sr_9Ca_5Cu_{24}O_{41}$, and $Ca_{2-x}Sr_xPbO_4$ wherein x is about 0.5, are from about 1 micron to about 10 microns, preferably from about 2 microns to about 6 microns.

In thermally processing the precursor composition to obtain the lead-doped bismuth-strontium-calcium-copper oxide superconductive material, the mixture of fine powder is generally heated at temperatures of from about 860° C. to about 870° C., preferably at temperatures from about 863° C. to about 865° C. The length of time for the thermally processing is generally from about 20 hours to about 50 hours. Shorter heating times may be used, although the resultant percentage of 2-2-2-3 phase material is expected to then be reduced. Longer heating times may also be used, but are generally seen as unnecessary.

The present invention is more particularly described in the following examples which are intended as illustrative only, since numerous modifications and variations will be apparent to those skilled in the art.

EXAMPLE A

Starting materials included basic copper carbonate ($Cu_2(OH)_2(CO_3)$) purchased commercially and having 99.9 percent purity), bismuth oxide ($Bi_2O_3$ purchased commercially and having 99.999 percent purity), strontium carbonate ($SrCO_3$ purchased commercially and having 99.999 percent purity), calcium carbonate ($CaCO_3$ purchased commercially and having 99.999 percent purity), copper oxide (CuO purchased commercially and having 99.999 percent purity), and lead oxide (PbO purchased commercially and having 98 percent purity). The starting materials were pre-dried in a vacuum oven and then stored in an inert atmosphere.

$Bi_4Sr_3Ca_3Cu_4O_{16\pm z}$ was prepared by mixing the following materials: bismuth oxide (30.3 grams (g)), strontium carbonate (14.4 g), calcium carbonate (9.7 g), and copper oxide (10.3 g). This mixture was milled in a high energy ball mill using an agate vial and agate balls for about four hours. The milled mixture was then sintered in a silver-lined alumina crucible at 790° C. for about 65 hours, at 820° C. for about 65 hours and at 835° C. for about 145 hours with about four hours of milling between each heating stage. The resultant product as characterized by powder diffraction and magnetic susceptibility (a $T_c$ of about 85 K) was $Bi_4Sr_3Ca_3Cu_4O_{16\pm z}$.

$Ca_{1.5}Sr_{0.5}PbO_4$ was prepared by mixing the following materials: strontium carbonate (15.7418 g), calcium carbonate (32.0174 g), and lead oxide (47.6009 g). This mixture was milled in an alumina ball mill jar using zirconia grinding media. The milled mixture was then sintered in an alumina crucible in air at 820° C. for about 48 hours and at 850° C. for about 48 hours, with hand grinding of the mixture with a mortar and pestle between each heating stage. The resultant product as characterized by powder diffraction was $Ca_{1.5}Sr_{0.5}PbO_4$. The product was sieved through a 400 mesh screen and then stored under an inert atmosphere.

$Sr_9Ca_5Cu_{24}O_{41}$ was prepared by mixing the following materials: strontium carbonate (53.2 g), calcium carbonate (20.0 g), and basic copper carbonate (76.80 g). This mixture was milled in a high energy ball mill using an agate vial and agate balls for about four hours. The milled mixture was then sintered in an alumina crucible in air at 770° C. for about 72 hours, at 800° C. for about 72 hours, at 855° C. for about 72 hours and at 900° C. for about 72 hours, with hand grinding of the mixture with a mortar and pestle between each heating stage. The resultant product as characterized by powder diffraction was $Sr_9Ca_5Cu_{24}O_{41}$. The product was stored under an inert atmosphere.

EXAMPLE 1

In preparation of $Bi_{2-y}Pb_ySr_2Ca_2Cu_3O_x$, the precursor materials $Bi_4Sr_3Ca_3Cu_4O_z$ and $Sr_9Ca_5Cu_{24}O_{41}$ were each separately ball milled for about one hour and then hand ground with a mortar and pestle for about one hour to obtain a fine particle size. The precursor of $Ca_{1.5}Sr_{0.5}PbO_4$ already had a fine particle size of about 3 microns in dimension. The precursor materials of $Bi_4Sr_3Ca_3Cu_4O_z$, $Sr_9Ca_5Cu_{24}O_{41}$, and $Ca_{1.5}Sr_{0.5}PbO_4$ were mixed i amounts calculated to achieve the targeted stoichiometry together and then ball milled for about three hours followed by hand grinding for about thirty minutes. Two samples of this mixture were pressed into a 12 millimeter (mm) pellet die under 1 kilobar (kb) of pressure and calcined in a pre-heated oven at 863° C. for about 24 hours in air and quenched or cooled in air on a copper plate. One sample was then ground, analyzed by x-ray diffraction and magnetic susceptibility and then repressed into a pellet. Analysis by x-ray diffraction showed that about 90 percent of the 2-2-2-3 phase material had formed in the first 24 hours of heating.

The two samples were then placed into the oven at 865° C. for about 48 hours, air quenched again upon a copper plate and ground up for analysis by x-ray diffraction and magnetic susceptibility. The two samples showed no difference in analysis. X-ray diffraction indicated full reaction of the precursor materials to yield a composition of $Bi_{1.8}Pb_{0.4}Sr_{2.0}Ca_{2.2}Cu_{3.0}O_{10}$. Magnetic susceptibility showed a critical transition temperature $T_c$ of 109K, a $T_c$ midpoint of 102K and a $4\pi\chi$ of 70 percent of the full shielding susceptibility. Post grinding was not found to change the analysis by x-ray diffraction or magnetic susceptibility. Longer sintering times also did not affect the analysis by x-ray diffraction or magnetic susceptibility.

The present process has demonstrated that the product of the general formula $Bi_aPb_bSr_cCa_dCu_eO_f$ wherein a is from about 1.7 to about 1.9, b is from about 0.3 to about 0.45, c is from about 1.6 to about 2.2, d is from about 1.6 to about 2.2, e is from about 2.97 to about 3.2 and f is $10\pm z$ can be prepared from the precursor materials $Bi_4Sr_3Ca_3Cu_4O_z$, $Sr_9Ca_5Cu_{24}O_{41}$, and $Ca_{1.5}Sr_{0.5}PbO_4$ in the comparatively short time of about 3 days. This is in contrast to conventional preparation times of about 2 weeks for synthesis methods from the simpler single metal oxides and/or carbonates.

Although the present invention has been described with reference to specific details, it is not intended that such details should be regarded as limitations upon the scope of the invention, except as and to the extent that they are included in the accompanying claims.

What is claimed is:

1. A composition of matter useful as a precursor mixture for subsequent processing into a high temperature superconductive product comprising a mixture of $Bi_4Sr_3Ca_3Cu_4O_{16\pm z}$ powder, an alkaline earth metal cuprate powder, and an alkaline earth metal plumbate powder, said mixture in amounts calculated to yield a lead-doped bismuth-strontium-calcium-cooper oxide superconductor of the formula $Bi_aPb_bSr_cCa_dCu_eO_f$ wherein a is from about 1.7 to about 1.9, b is from about 0.3 to about 0.45, c is from about 1.6 to about 2.2, d is from about 1.6 to about 2.2, e is from about 2.97 to about 3.2 and f is $10\pm z$ upon subsequent thermal processing.

2. The composition of claim 1 wherein the alkaline earth metal cuprate is $Sr_9Ca_5Cu_{24}O_{41}$ and the alkaline earth metal plumbate is $Ca_{1.5}Sr_{0.5}PbO_4$.

3. The composition of claim 1 wherein the mixture of powders have particle sizes within the range of from about 1 micron to about 10 microns.

4. A process for preparing a lead-doped bismuth-strontium-calcium-copper oxide superconductor of the formula $Bi_aPb_bSr_cCa_dCu_eO_f$ wherein a is from about 1.7 to about 1.9, b is from about 0.3 to about 0.45, c is from about 1.6 to about 2.2, d is from about 1.6 to about 2.2, e is from about 2.97 to about 3.2 and f is $10\pm z$ comprising:

reacting a mixture of $Bi_4Sr_3Ca_3Cu_4O_{16\pm z}$ powder, an alkaline earth metal cuprate powder, and an alkaline earth metal plumbate powder at temperatures and for time sufficient to form a lead-doped bismuth-strontium-calcium-copper oxide superconductor of the formula $Bi_aPb_bSr_cCa_dCu_eO_f$ wherein a is from about 1.7 to about 1.9, b is from about 0.3 to about 0.45, c is from about 1.6 to about 2.2, d is from about 1.6 to about 2.2, e is from about 2.97 to about 3.2 and f is $10\pm z$.

5. The process of claim 4 wherein the alkaline earth metal cuprate is $Sr_9Ca_5Cu_{24}O_{41}$ and the alkaline earth metal plumbate is $Ca_{1.5}Sr_{0.5}PbO_4$.

6. The process of claim 4 wherein the mixture of powders have particle sizes within the range of from about 1 micron to about 10 microns.

7. The process of claim 4 wherein said reaction is conducted at temperatures of from about 860° C. to about 870° C. for from about 20 hours to about 50 hours.

* * * * *